United States Patent
Yin et al.

(10) Patent No.: US 10,848,699 B2
(45) Date of Patent: Nov. 24, 2020

(54) VISIBLE LIGHT COMMUNICATION SENSOR AND VISIBLE LIGHT COMMUNICATION METHOD

(71) Applicant: Guangzhou Tyrafos Semiconductor Technologies Co., LTD, Guangzhou (CN)

(72) Inventors: Ping-Hung Yin, Taipei (TW); Jia-Shyang Wang, Miaoli County (TW)

(73) Assignee: Guangzhou Tyrafos Semiconductor Technologies Co., LTD, Guangzhou (CN)

( * ) Notice: Subject to any disclaimer, the term of this patent is extended or adjusted under 35 U.S.C. 154(b) by 0 days.

(21) Appl. No.: 16/507,042

(22) Filed: Jul. 10, 2019

(65) Prior Publication Data

US 2020/0021359 A1 Jan. 16, 2020

Related U.S. Application Data

(60) Provisional application No. 62/696,322, filed on Jul. 10, 2018.

(51) Int. Cl.
*H04N 5/3745* (2011.01)
*G01N 21/552* (2014.01)
(Continued)

(52) U.S. Cl.
CPC ....... *H04N 5/37452* (2013.01); *G01N 21/554* (2013.01); *G01N 21/645* (2013.01); *G02B 5/22* (2013.01); *G02B 5/285* (2013.01); *H01L 31/1126* (2013.01); *H04B 10/116* (2013.01); *H04L 7/0075* (2013.01); *H04N 5/353* (2013.01);
(Continued)

(58) Field of Classification Search
CPC .. G01N 21/648; G01N 21/645; G01N 21/554; G01N 21/6452; G01N 2021/6471; G01N 2201/064; G02B 5/285; G02B 5/22; H04N 5/3696; H04N 5/37452;
(Continued)

(56) References Cited

U.S. PATENT DOCUMENTS

| | | | |
|---|---|---|---|
| 2012/0001055 A1* | 1/2012 | Lee | H03K 4/08 250/208.1 |
| 2015/0163433 A1* | 6/2015 | Uchida | H04N 5/37452 250/208.1 |

(Continued)

*Primary Examiner* — Mina M Shalaby
(74) *Attorney, Agent, or Firm* — JCIPRNET

(57) ABSTRACT

A visible light communication sensor and visible light communication method are provided. The visible light communication sensor includes a comparator, a sensing unit, and a first ramp signal generator. The comparator includes a first input terminal, a second input terminal, and an output terminal. The sensing unit is coupled to the first input terminal of the comparator. The sensing unit is configured to sense a visible light communication signal to output a sensing signal to the first input terminal of the comparator. The first ramp signal generator is coupled to the second input terminal of the comparator and is configured to output the first ramp signal to the second input terminal of the comparator. The comparator outputs a comparison result signal via the output terminal according to the voltage values of the first input terminal and the second input terminal.

7 Claims, 3 Drawing Sheets

(51) Int. Cl.
  *G01N 21/64*   (2006.01)
  *G02B 5/22*    (2006.01)
  *G02B 5/28*    (2006.01)
  *H01L 31/112*  (2006.01)
  *H04B 10/116*  (2013.01)
  *H04L 7/00*    (2006.01)
  *H04N 5/353*   (2011.01)
  *H04N 5/369*   (2011.01)
  *H04N 5/378*   (2011.01)
  *H04N 9/04*    (2006.01)

(52) U.S. Cl.
  CPC ........... *H04N 5/3696* (2013.01); *H04N 5/378* (2013.01); *H04N 9/045* (2013.01); *G01N 2201/064* (2013.01)

(58) Field of Classification Search
  CPC ........ H04N 9/045; H04N 5/353; H04N 5/378; H01L 31/1126; H04L 7/0075; H04B 10/116
  See application file for complete search history.

(56) References Cited

U.S. PATENT DOCUMENTS

| | | | |
|---|---|---|---|
| 2016/0227135 A1* | 8/2016 | Matolin | H04N 3/155 |
| 2017/0280077 A1* | 9/2017 | Yun | H01L 27/14609 |
| 2017/0289475 A1* | 10/2017 | Ha | H01L 27/14634 |
| 2017/0302871 A1* | 10/2017 | Kim | H04N 5/3698 |
| 2017/0318247 A1* | 11/2017 | Kim | H04N 5/378 |
| 2017/0350756 A1* | 12/2017 | Panicacci | G01J 1/4228 |
| 2017/0352694 A1* | 12/2017 | Panicacci | H01L 27/14609 |
| 2017/0352696 A1* | 12/2017 | Panicacci | H01L 27/14643 |
| 2018/0376090 A1* | 12/2018 | Liu | H04N 5/3745 |

\* cited by examiner

VISIBLE LIGHT COMMUNICATION SENSOR AND VISIBLE LIGHT COMMUNICATION METHOD

CROSS-REFERENCE TO RELATED APPLICATION

This application claims the priority benefit of U.S. provisional application Ser. No. 62/696,322, filed on Jul. 10, 2018. The entirety of the above-mentioned patent application is hereby incorporated by reference herein and made a part of this specification.

BACKGROUND

Technical Field

The present disclosure relates to a communication technology, and in particular to a visible light communication sensor and a visible light communication method.

Description of Related Art

With the evolution of wireless communication technology, the use of visible light for message transmission is one of the important field requiring research and development of the wireless communication industry. Visible Light Communication (VLC) technology can be applied, for example, to various fields such as light fidelity, visible light video on demand services, visible light wireless broadcasting or visible light positioning, and has the advantages of high energy efficiency, low electromagnetic interference, and development of new spectrum. However, it remains an issue to find out how to integrate visible light communication technology into existing specific functional components of current electronic products to increase the applicability of visible light communication. Therefore, some embodiments as the solutions for making the specific functional components of the electronic product integrated with the visible light communication function to perform its existing functions normally, and also effectively and accurately sense the visible light signal are proposed below.

SUMMARY

The disclosure provides a visible light communication sensor and a visible light communication method, which can effectively receive visible light communication signals.

The visible light communication sensor of the present disclosure includes a comparator, a sensing unit, and a first ramp signal generator. The comparator includes a first input terminal, a second input terminal, and an output terminal. The sensing unit is coupled to the first input terminal of the comparator, and configured to sense the visible light communication signal to output the sensing signal to the first input terminal of the comparator. The first ramp signal generator is coupled to the second input terminal of the comparator and configured to output the first ramp signal to the second input terminal of the comparator. The comparator outputs the comparison result signal through the output terminal according to the voltage values of the first input terminal and the second input terminal.

The visible light communication method of the present disclosure is adapted for a visible light communication sensor. The visible light communication sensor includes a comparator, a sensing unit, and a first ramp signal generator. The visible light communication method includes the steps of: sensing a visible light communication signal by the sensing unit to output a sensing signal to a first input terminal of the comparator; and outputting the first ramp signal to the second input terminal of the comparator by the first ramp signal generator; and outputting the comparison result signal through the output terminal by the comparator according to the voltage values of the first input terminal and the second input terminal.

Based on the above, the visible light communication sensor and the visible light communication method of the present disclosure can effectively sense the visible light communication signal by disposing the visible light communication sensor in the pixel array of the image sensor for sensing the image, and the image sensing function of the image sensor can be performed by means of timing control.

In order to make the aforementioned features and advantages of the disclosure more comprehensible, embodiments accompanying figures are described in detail below.

DESCRIPTION OF THE EMBODIMENTS

Figure 1:
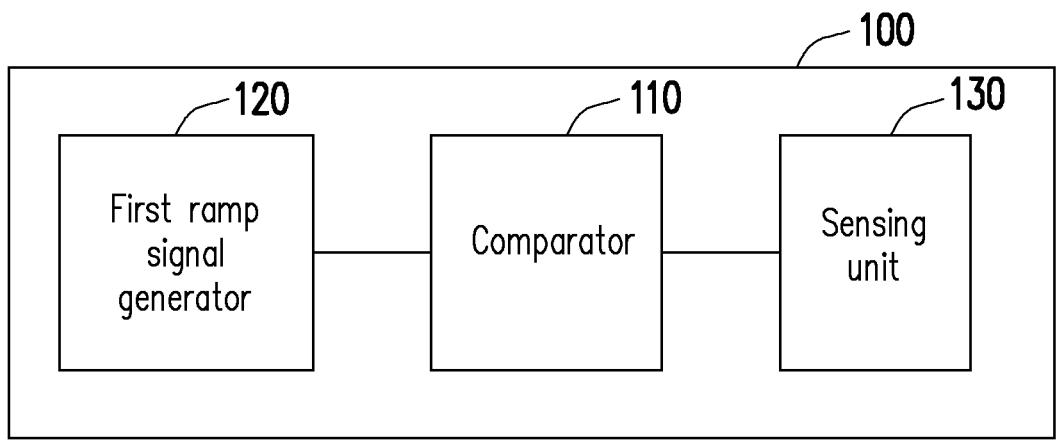
FIG. 1 is a functional circuit diagram of a visible light communication sensor according to an embodiment of the present disclosure.

In order to make the content of the present disclosure more comprehensible, specific embodiments as examples of the disclosure that can be actually implemented are provided below. In addition, wherever possible, elements/components/steps denoted by the same reference numerals in the drawings and the embodiments represent the same or similar parts.

FIG. 1 is a functional circuit diagram of a visible light communication sensor according to an embodiment of the present disclosure. Referring to FIG. 1, a visible light communication sensor 100 includes a comparator 110, a first ramp signal generator 120, and a sensing unit 130. The first input terminal of the comparator 110 is coupled to the sensing unit 130. The sensing unit 130 can be, for example, one or more pixel units corresponding to a Complementary Metal-Oxide-Semiconductor Image Sensor (CIS). The second input terminal of the comparator 110 is coupled to the sensing unit 130. In this embodiment, the first ramp signal generator 120 is configured to generate a ramp signal to the second input terminal of the comparator 110. When the sensing unit 130 senses the visible light communication signal, the sensing unit 130 transmits the sensing signal to the first input terminal of the comparator 110. Therefore, the comparator 110 can output the comparison result signal through the output terminal according to the voltage values of the ramp signal and the sensing signal, so that the related signal processing unit (not shown) coupled to the output terminal of the comparator 110 can further process or convert the comparison result signal into the corresponding visible light communication data. In an embodiment, the signal processing unit may include, for example, a synchronous circuit, a Clock and Data Recovery (CDR) circuit, a Digital to Analog Converter (DAC), or a related data correcting and computing circuit, the disclosure is not limited thereto. The signal processing unit may generate corresponding visible light communication data according to the comparison result signal.

Figure 2:
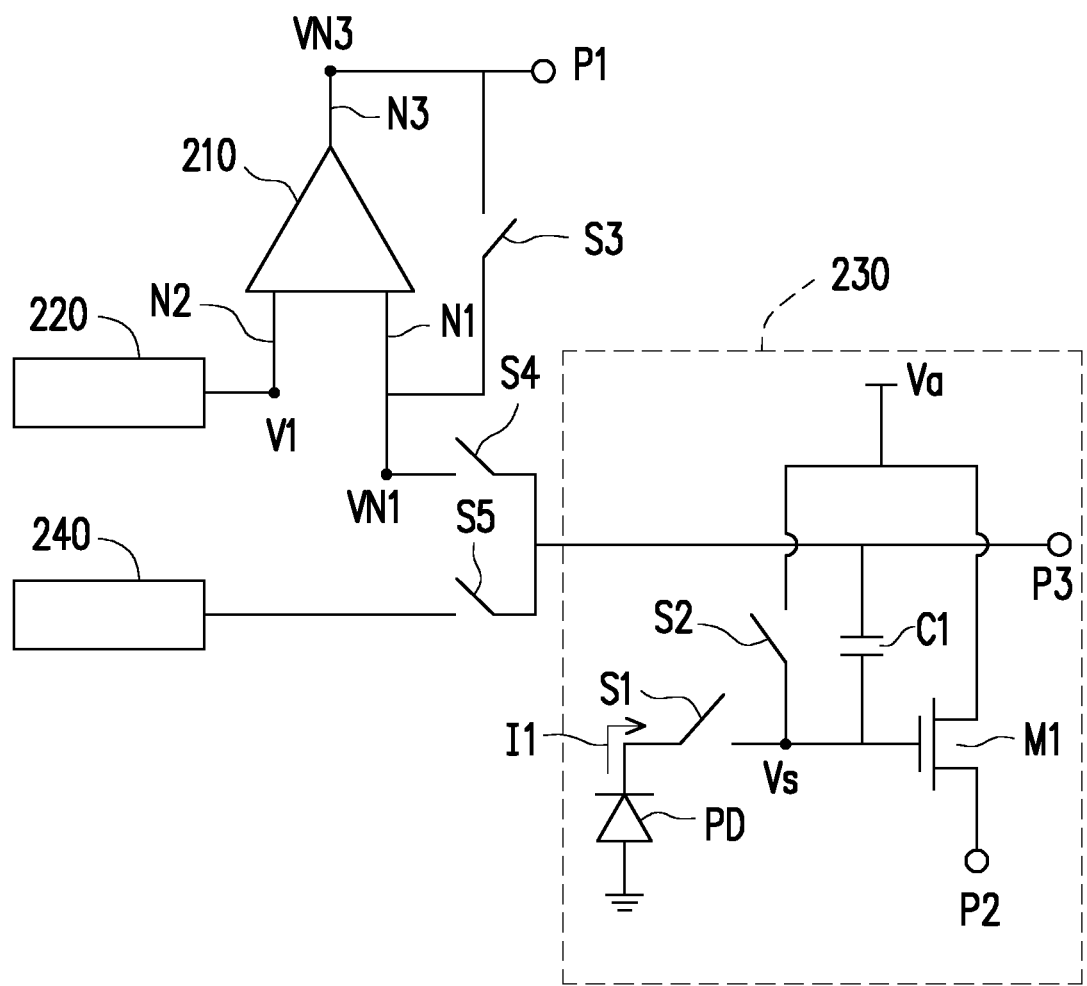
FIG. 2 is a circuit diagram of a visible light communication sensor according to an embodiment of the disclosure.

FIG. 2 is a circuit diagram of a visible light communication sensor according to an embodiment of the disclosure. This embodiment explains how to sense a visible light communication signal by using a pixel unit of an image sensor. Referring to FIG. 2, a visible light communication sensor 200 includes a comparator 210, a first ramp signal generator 220, a sensing unit 230, and a second ramp signal generator 240. The visible light communication sensor 200 of the present embodiment may be, for example, a circuit structure using a ramp analog to digital converter (Ramp ADC). The sensing unit 230 can be, for example, one or more pixel units corresponding to the CMOS image sensor. The sensing unit 230 can be selectively operated in one of an image sensing mode and a visible light communication mode. In this embodiment, the first terminal N1 of the comparator 210 is coupled to the output terminal N3 of the comparator 210 and the first terminal point P1 through the switch S3. The first terminal point P1 can be coupled to the related signal processing unit (not shown) at the back end to analyze or convert the comparison result signal outputted by the output terminal N3 of the comparator 210 into the corresponding visible light communication data. Moreover, the first terminal N1 of the comparator 210 is coupled to the sensing unit 230 through the signal line (for example, the signal line extended from the third terminal point P3) of the image sensor and the switch S4. The second terminal N2 of the comparator 210 is coupled to the first ramp signal generator 220 to receive the ramp signal provided by the first ramp signal generator 220.

In this embodiment, the sensing unit 230 includes a photodiode PD, a storage capacitor C1, a switch S1, a first reset switch S2, and a pixel switch M1. The pixel switch M1 can be a transistor switch. One terminal of the photodiode PD is grounded, and the other terminal of the photodiode PD is coupled to the switch S1. One terminal of the switch S1 is coupled to one terminal of the storage capacitor C1, one terminal of the first reset switch S2, and a control terminal of the pixel switch M1. The first reset switch S2 is coupled to the power voltage Va. The other terminal of the storage capacitor C1 is coupled to a row signal line or a column signal line (for example, a signal line extended from the third terminal point P3) of the image sensor. The first terminal of the pixel switch M1 is coupled to the power voltage Va, and the second terminal of the pixel switch M1 is coupled to the second terminal point P2. In the embodiment, the second ramp signal generator 240 is coupled to the sensing unit 230 through the switch S5, so that the sensing unit 230 outputs the sensing signal through the point P2 in the image sensing mode. In this embodiment, when the first reset switch S2 is operated at a conducting state, the storage capacitor C1 is made to store energy. Meanwhile, the first reset switch S2 and the second reset switch S3 are simultaneously turned on. When the second reset switch S3 is operated at a conducting state, the first input terminal of the comparator 210 is reset to a reset potential. In this embodiment, when the sensing unit 230 is operated in the visible light communication mode, the switch S4 is operated at a conducting state, and the switch S5 is operated at a non-conducting state.

Specifically, when the sensing unit 230 is operated in the image sensing mode, the switch S5 is operated at a conducting state, and the second ramp signal generator 240 is configured to perform an analog-to-digital conversion operation. The switch S1 and the first reset switch S2 can switch their conduction states according to a specific timing. Therefore, the photodiode PD can sense the image to generate the sensing signal I1 to the control terminal of the pixel switch M1, so that the pixel switch M1 provides the corresponding image sensing signal to the second terminal point P2 according to the sensing signal I1, wherein the second terminal point P2 can be coupled to the image processing circuit (not shown). In this embodiment, when the sensing unit 230 is operated in the image sensing mode, another operation mode is as follows, and the switch S5 is operated at a non-conducting state. The switch S1 and the first reset switch S2 can switch their conduction states according to a specific timing. Therefore, the photodiode PD can sense the image to generate the sensing signal I1 to the control terminal of the pixel switch M1, so that the pixel switch M1 provides the corresponding image sensing signal to the second terminal point P2 according to the sensing signal I1, wherein the second terminal point P2 can be coupled to an image processing circuit (not shown) for Correlated Double Sampling (CDS) operation.

When the sensing unit 230 is operated in the visible light communication mode, the switch S4 is operated at a conducting state, and S5 is operated at a non-conducting state, the switch S1 can be switched to a conducting state according to another specific timing, and the photodiode PD provides the sensing signal I1 through the storage capacitor C1 to the first input terminal N1 of the comparator 210, and the first ramp signal generator 220 provides a ramp signal to the second input terminal N2 of the comparator 210. Therefore, the comparator 210 can output the comparison result signal through the output terminal N3 according to the voltage values of the first input terminal N1 and the second input terminal N2. In this embodiment, the first ramp signal generator 220 and the second ramp signal generator 240 may respectively include a capacitor unit and a switch unit to generate a ramp signal by means of charging and discharging.

Figures 3, 4:
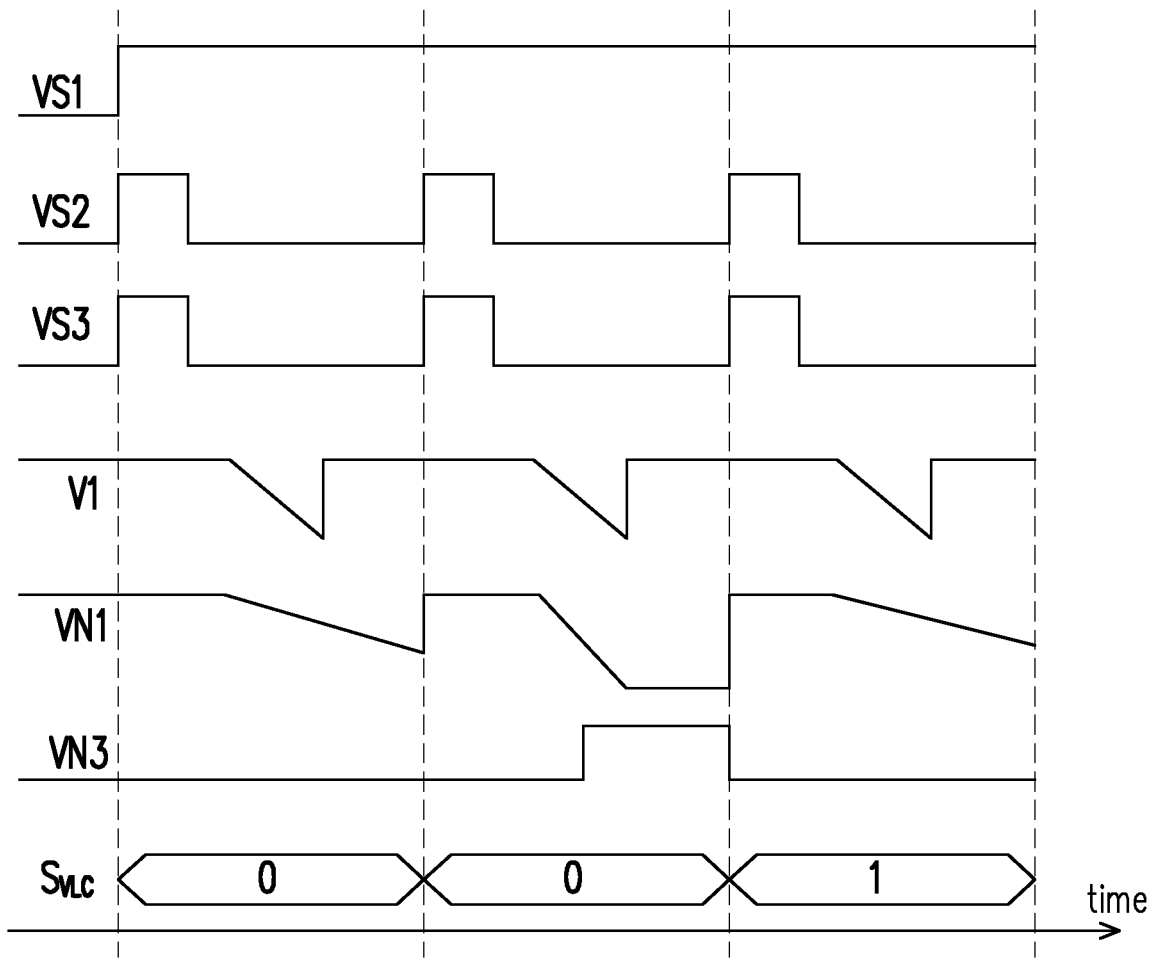
FIG. 3 is a timing diagram of a visible light communication sensor operating in a visible light communication mode according to an embodiment of the present disclosure.
FIG. 4 is a schematic diagram of a pixel array of a visible light communication sensor according to an embodiment of the present disclosure.

FIG. 3 is a timing diagram of a visible light communication sensor operating in a visible light communication mode according to an embodiment of the present disclosure. Referring to FIG. 2 and FIG. 3, the timing diagram of this embodiment can be adapted for the visible light communication sensor 200 of FIG. 2. For example, when the sensing unit 230 is operated in the visible light communication mode, the switch S1 can receive the voltage signal VS1 to be continuously turned on, and the first reset switch S2 and the second reset switch S3 can receive the voltage signals VS2 and VS3 respectively, so that the first reset switch S2 and the second reset switch S3 are periodically turned on. In this embodiment, when the first reset switch S2 is turned on, the storage capacitor C1 is made to restore energy so that the voltage Vs is correspondingly reset to a high potential state. Moreover, when the second reset switch S3 is turned on, the voltage of the first output terminal N1 of the comparator 210 is reset to a reset potential state.

In this example, after the voltage Vs is reset to the high potential state, the first ramp signal generator 220 provides a ramp signal to the second input terminal N2 of the comparator 210, thus the voltage VN1 of first input terminal N1 and the voltage V1 of the second input terminal N2 of the comparator 210 are as shown in FIG. 3. Moreover, if the photodiode PD does not sense the visible light, the sensing signal I1 (electron current) provided by the photodiode PD is lower or zero, and degree at which the voltage VN1 of the first input terminal N1 of the comparator 210 drops is lower or 0. In other words, in the case where the photodiode PD does not sense the visible light, the ramp signal provided by the first ramp signal generator 220 causes the voltage V1 of the second input terminal N2 of the comparator 210 to decrease by a larger amplitude, the photodiode PD causes the voltage VN1 of the first input terminal N1 of the comparator 210 to decrease by a smaller amplitude, and the voltage of the second input terminal N2 of the comparator 210 is lower than the voltage of the first input terminal N1, therefore, the voltage or visible light signal $S_{VLC}$ of the output terminal N3 of the comparator 210 is 0.

However, in this example, if the photodiode PD senses the visible light, the sensing signal I1 (electron current) provided by the photodiode PD is higher or 1, then the voltage N1 of the first input terminal N1 of the comparator 210 drops by a larger amplitude. As shown in FIG. 3, the voltage drop amplitude of the voltage VN1 of the first input terminal N1 of the comparator 210 is increased, and the drop amplitude thereof is greater than the voltage drop amplitude of the voltage V1 of the second input terminal N2 of the comparator 210. In other words, in the case where the photodiode PD senses the visible light, the photodiode PD causes the drop amplitude of the voltage VN1 of the first input terminal N1 of the comparator 210 to be larger than the drop amplitude of the voltage V1 of the second input terminal N2 of the comparator 210, and the voltage of the second input terminal N2 of the comparator 210 is higher than the voltage of the first input terminal N1, therefore, the voltage or visible light signal $S_{VLC}$ of the output terminal N3 of the comparator 210 is 1. Then, in the next cycle, the first reset switch S2 and the second reset switch S3 are turned on, so that the storage capacitor C1 is made to restore energy and the voltage Vs is correspondingly reset to a high potential state. In this manner, the visible light communication sensor 200 of the embodiment can effectively and accurately sense the visible light signal.

FIG. 4 is a schematic diagram of a pixel array of a visible light communication sensor according to an embodiment of the present disclosure. Referring to FIG. 2 and FIG. 4, the sensing unit 230 of FIG. 2 may be disposed in the pixel array 400 of the image sensor and correspond to one or more image sensing pixels. In this embodiment, the pixel array 400 may include a plurality of image sensing pixels, which may include, for example, image sensing pixels R, G, B corresponding to a red pixel type, a green pixel type, and a blue pixel type, but the disclosure is not limited thereto. In this embodiment, at least a portion of the plurality of image sensing pixels in the pixel array 400 respectively include the sensing unit 230, and the image sensing pixels are connected in series to the first input terminal N1 of the comparator 210 through the third terminal point P3. Moreover, in the embodiment, the image sensing pixels respectively including the sensing unit 230 may be image sensing pixels of the same color pixel type, but the disclosure is not limited thereto. In an embodiment, the image sensing pixels respectively including the sensing unit 230 may include image sensing pixels of at least one color pixel type.

Figure 5:
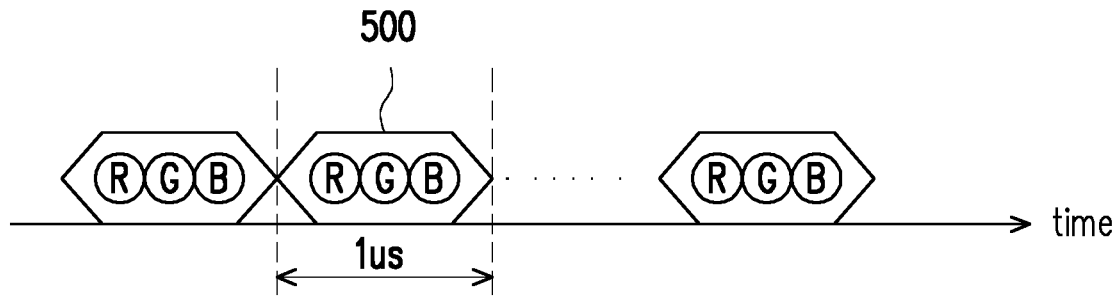
FIG. 5 is a timing diagram showing data transmission of a visible light communication signal according to an embodiment of the disclosure.

FIG. 5 is a timing diagram showing data transmission of a visible light communication signal according to an embodiment of the disclosure. Referring to FIG. 2, FIG. 4, and FIG. 5, the sensing unit 230 of FIG. 2 may be disposed in the pixel array 400 of the image sensor, and the pixel array 400 may include, for example, image sensing pixels R, G, B corresponding to a red pixel type, a green pixel type, and a blue pixel type. Therefore, after the comparison result signal outputted through the output terminal N3 of the comparator 210 of the visible light communication sensor 200 is further processed or converted, it is possible to make further output through the data transmitting method of the visible light communication signal as shown in FIG. 5. As shown in FIG. 5, the visible light communication sensor 200 can output visible light communication data 500 during a time period of a data, wherein the visible light communication data 500 can include data acquired by the image sensing pixels R, G, B of a red pixel type, a green pixel type, and a blue pixel type, therefore, the data transmitting amount may be triplicated, and the time period thereof may be as shortened to, for example, 1 microsecond (μs), but the present disclosure is not limited thereto. In an embodiment, the pixel array 400 of the image sensor has only a plurality of image sensing pixels of the same color pixel type as the sensing unit 230, therefore, the visible light communication data 500 outputted by the visible light communication sensor 200 may also include data obtained by only one of the image sensing pixels R, G, and B of the red pixel type, the green pixel type, and the blue pixel type.

Figure 6:
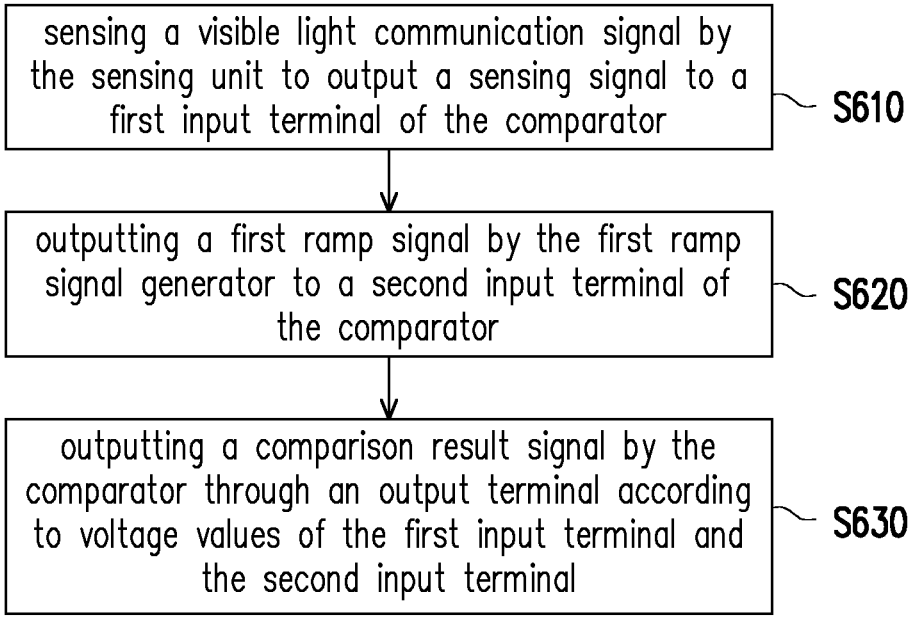
FIG. 6 is a flow chart of a visible light communication method according to an embodiment of the present disclosure.

FIG. 6 is a flow chart of a visible light communication method according to an embodiment of the present disclosure. Referring to FIG. 1 and FIG. 6, the visible light communication method of the present embodiment can be at least adapted to the visible light communication sensor 100 of the embodiment of FIG. 1. The visible light communication sensor 100 includes the comparator 110, the first ramp signal generator 120, and the sensing unit 130. In step S610, the sensing unit 130 senses the visible light communication signal to output the sensing signal to the first input terminal of the comparator 110. In step S620, the first ramp signal generator 120 outputs the first ramp signal to the second input terminal of the comparator 110. In step S630, the comparator 110 outputs the comparison result signal through the output terminal according to the voltage values of the first input terminal and the second input terminal. Moreover, the comparator 110 can output, for example, the comparison result signal to the signal processing unit, so that the signal processing unit can generate the corresponding visible light communication data according to the comparison result signal. Therefore, the visible light communication method of the present embodiment has an effect of effectively sensing the visible light communication signal.

In addition, sufficient teaching regarding other related technical details, component features, or implementation of the visible light communication sensor 100 of the present embodiment can be derived from the descriptions in the embodiments of FIG. 1 to FIG. 5, and no further details are incorporated herein.

In summary, the visible light communication sensor and the visible light communication method of the present disclosure can sense the visible light communication signal by the sensing unit, and compare the sensing signal with the ramp signal by the comparator to output the comparison result signal, so that the comparison result signal may generate corresponding visible light communication data after signal processing. Moreover, the visible light communication sensor can be disposed in the pixel array of the image sensor for sensing the image. That is to say, the visible light communication sensor and the visible light communication method of the present disclosure can effectively and accurately sense the visible light signal, and can perform image sensing function by means of timing control or simultaneously perform the image sensing function and the visible light communication function.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A visible light communication sensor, comprising:
a comparator, comprising a first input terminal, a second input terminal, and an output terminal;
a sensing unit, coupled to the first input terminal of the comparator, and configured to sense a visible light communication signal to output a sensing signal to the first input terminal of the comparator;
a first ramp signal generator, coupled to the second input terminal of the comparator, and configured to output a first ramp signal to the second input terminal of the comparator when the sensing unit is operated in a visible light communication mode; and
a second ramp signal generator, coupled to the sensing unit through a switch, and configured to output a second ramp signal to the sensing unit when the sensing unit is operated in an image sensing mode,
wherein the comparator outputs a comparison result signal through the output terminal according to voltage values of the first input terminal and the second input terminal,
wherein the sensing unit comprises:
a photodiode, configured to sense the visible light communication signal during the visible light communication mode, and output a sensing signal during the image sensing mode;
a storage capacitor, wherein one terminal of the storage capacitor is coupled to the photodiode and another terminal of the storage capacitor is coupled to the first input terminal of the comparator;
a first reset switch, having one terminal coupled to the photodiode and the storage capacitor, and the other terminal coupled to a power voltage, wherein the storage capacitor is made to store energy when the first reset switch is operated at a conducting state, so that a voltage of the one terminal of the storage capacitor is reset to a high potential state of power voltage, and a voltage of the another terminal of the storage capacitor is reset to a reset potential state of the first output terminal of the comparator; and
a pixel switch, wherein a control terminal of the pixel switch is coupled to the photodiode and the second ramp signal generator through the switch and the storage capacitor, and a first terminal of the pixel switch is coupled to a power voltage,
wherein a second terminal of the pixel switch outputs an image sensing signal according to the sensing signal and the second ramp signal during the image sensing mode, and the comparator outputs the comparison result signal during the visible light communication mode.

2. The visible light communication sensor of claim 1, further comprising:
a second reset switch, coupled to a first terminal of the comparator and the output terminal of the comparator, wherein the first reset switch and the second reset switch are simultaneously turned on.

3. The visible light communication sensor of claim 1, wherein the sensing unit is disposed in a pixel array of an image sensor.

4. The visible light communication sensor of claim 3, wherein at least a portion of a plurality of image sensing pixels in the pixel array are used as the sensing unit, and the image sensing pixels are connected in series to the first input terminal of the comparator.

5. The visible light communication sensor of claim 4, wherein the image sensing pixels as the sensing unit comprise at least one color pixel type.

6. The visible light communication sensor of claim 4, wherein when the image sensing pixels are operated in an image data reading stage, the comparator of the sensing unit of each of the image sensing pixels stops outputting the comparison result signal, and when the image sensing pixels are operated in an image data conversion stage, the comparator of the sensing unit of each of the image sensing pixels outputs the comparison result signal.

7. A visible light communication method, adapted for a visible light communication sensor, the visible light communication sensor comprising a comparator, a sensing unit, a first ramp signal generator and a second ramp signal generator, wherein the method comprises:
sensing a visible light communication signal by the sensing unit to output a sensing signal to a first input terminal of the comparator;
outputting a first ramp signal by the first ramp signal generator to a second input terminal of the comparator when the sensing unit is operated in a visible light communication mode; and
outputting a second ramp signal by the second ramp signal generator to the sensing unit through a switch when the sensing unit is operated in an image sensing mode,
outputting a comparison result signal by the comparator through an output terminal according to voltage values of the first input terminal and the second input terminal,
wherein the sensing unit comprises:
a photodiode, configured to sense the visible light communication signal during the visible light communication mode, and output a sensing signal during the image sensing mode;
a storage capacitor, wherein one terminal of the storage capacitor is coupled to the photodiode and another terminal of the storage capacitor is coupled to the first input terminal of the comparator;
a first reset switch, having one terminal coupled to the photodiode and the storage capacitor, and the other terminal coupled to a power voltage, wherein the storage capacitor is made to store energy when the first reset switch is operated at a conducting state, so that a voltage of the one terminal of the storage capacitor is reset to a high potential state of power voltage, and a voltage of the another terminal of the storage capacitor is reset to a reset potential state of the first output terminal of the comparator; and
a pixel switch, wherein a control terminal of the pixel switch is coupled to the photodiode and the second ramp signal generator through the switch and the storage capacitor, and a first terminal of the pixel switch is coupled to a power voltage,
wherein a second terminal of the pixel switch outputs an image sensing signal according to the sensing signal and the second ramp signal during the image sensing mode, and the comparator outputs the comparison result signal during the visible light communication mode.

\* \* \* \* \*